United States Patent
Lee et al.

(10) Patent No.: US 10,930,884 B2
(45) Date of Patent: Feb. 23, 2021

(54) ORGANIC LIGHT-EMITTING DISPLAY DEVICE AND METHOD OF MANUFACTURING THE SAME

(71) Applicant: SAMSUNG DISPLAY CO., LTD., Yongin-si (KR)

(72) Inventors: Seungmin Lee, Yongin-si (KR); Taehyun Kim, Yongin-si (KR); Donghwan Shim, Yongin-si (KR); Jungkyu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 8 days.

(21) Appl. No.: 16/262,204

(22) Filed: Jan. 30, 2019

(65) Prior Publication Data

US 2019/0245161 A1 Aug. 8, 2019

(30) Foreign Application Priority Data

Feb. 8, 2018 (KR) .......................... 10-2018-0015802

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3258* (2013.01); *H01L 27/3276* (2013.01);
(Continued)

(58) Field of Classification Search
CPC ......... H01L 2227/323; H01L 2251/566; H01L 27/3258; H01L 27/3276; H01L 51/0011;
(Continued)

(56) References Cited

U.S. PATENT DOCUMENTS 7,928,656 B2 4/2011 Imamura
9,941,484 B2 4/2018 Kim
(Continued)

FOREIGN PATENT DOCUMENTS

| JP | 2005-209412 | 8/2005 |
|---|---|---|
| JP | 2008-165251 | 7/2017 |
| KR | 10-2015-0094950 | 8/2015 |

*Primary Examiner* — Long K Tran
(74) *Attorney, Agent, or Firm* — F. Chau & Associates, LLC

(57) ABSTRACT

An organic light-emitting display device includes a substrate and a display area over the substrate. The display area includes a plurality of organic light-emitting diodes each including a first electrode, an emission layer, and a second electrode. A first power supply line is located outside the display area and is configured to supply power to the plurality of organic light-emitting diodes. A protective portion is disposed on an end of the first power supply line facing away from the display area. An encapsulation unit includes a first inorganic encapsulation layer, an organic encapsulation layer, and a second inorganic encapsulation layer. The encapsulation unit is positioned in the display area. A dam unit is arranged between the first inorganic encapsulation layer and the second inorganic encapsulation layer. The dam unit is disposed on an end of the organic encapsulation layer facing away from the display area.

12 Claims, 12 Drawing Sheets

(52) U.S. Cl.
CPC ..... *H01L 51/0011* (2013.01); *H01L 2227/323* (2013.01); *H01L 2251/566* (2013.01)

(58) Field of Classification Search
CPC .............. H01L 51/5246; H01L 51/525; H01L 51/5253
USPC ......................................................... 257/40
See application file for complete search history.

(56) References Cited

U.S. PATENT DOCUMENTS

| | | |
|---|---|---|
| 2016/0365398 A1 | 12/2016 | Kim et al. |
| 2017/0288008 A1* | 10/2017 | Kim ................... H01L 51/0097 |
| 2017/0288168 A1* | 10/2017 | Kim ................... H01L 51/5253 |
| 2018/0102502 A1* | 4/2018 | Kim ................... H01L 27/3258 |

* cited by examiner

ORGANIC LIGHT-EMITTING DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2018-0015802, filed on Feb. 8, 2018, in the Korean Intellectual Property Office, the disclosure of which is incorporated by reference herein in its entirety.

1. TECHNICAL FIELD

Exemplary embodiments of the present invention relate to an organic light-emitting display device, and more particularly, to a method of manufacturing the same.

2. DISCUSSION OF RELATED ART

An organic light-emitting display device may include a hole injection electrode, an electron injection electrode, and an organic light-emitting diode including an emission layer. The organic light-emitting display device may be a self-emissive display device in which excitons emit light while falling from an excited state to a ground state, the excitons being generated when holes injected from the hole injection electrode and electrons injected from the electron injection electrode are combined in the emission layer.

An organic light-emitting display device, which is a self-emissive display device, might not include a separate light source, and thus it may be driven with a relatively low voltage, and may be configured to have a relatively light-weight and slim profile. The organic light-emitting display device may have relatively wide viewing angles, relatively high contrast, and relatively fast response speeds.

SUMMARY

An exemplary embodiment of the present invention provides, for example, an organic light-emitting display device and a method of manufacturing the same, which may prevent deterioration of a display quality and reduce a dead space.

According to an exemplary embodiment of the present invention, an organic light-emitting display device includes a substrate and a display area over the substrate. The display area includes a plurality of organic light-emitting diodes each including a first electrode, an emission layer, and a second electrode. A first power supply line is located outside the display area and is configured to supply power to the plurality of organic light-emitting diodes. A protective portion is disposed on an end of the first power supply line facing away from the display area. An encapsulation unit includes a first inorganic encapsulation layer, an organic encapsulation layer, and a second inorganic encapsulation layer. The encapsulation unit is positioned in the display area. A dam unit is arranged between the first inorganic encapsulation layer and the second inorganic encapsulation layer. The dam unit is disposed on an end of the organic encapsulation layer facing away from the display area.

Surface energy of a material included in the dam unit may be greater than surface energy of a material included in the organic encapsulation layer.

The dam unit may include silicon.

A thickness of the dam unit may be less than a thickness of the organic encapsulation layer.

The dam unit may be located closer to the display area than the first power supply line.

The organic light-emitting display device may include a connection conductive layer located outside the display area. The connection conductive layer may be configured to connect the second electrode to the first power supply line.

The connection conductive layer may include a material that is the same as a material included in the first electrode.

A first end of the connection conductive layer may overlap the second electrode. A second end of the connection conductive layer may overlap the first power supply line.

The connection conductive layer, the first inorganic encapsulation layer, and the second inorganic encapsulation layer may be sequentially stacked over the first power supply line.

The organic light-emitting display device may include a thin film transistor arranged over the substrate and electrically connected to a corresponding first electrode of each of the organic light-emitting diodes. An organic insulating layer may be arranged between the thin film transistor and the corresponding first electrode of each of the organic light-emitting diodes. The dam unit may be arranged over the organic insulating layer.

The first power supply line may be arranged between the organic insulating layer and the protective portion.

The protective portion may include a material that is the same as a material included in the organic insulating layer.

According to an exemplary embodiment of the present invention, a method of manufacturing an organic light-emitting display device includes forming, over a substrate, a thin film transistor and a first power supply line. The method includes forming a protective portion including a first insulating layer on the thin film transistor and on the first power supply line. The method includes forming a masking unit spaced apart from the protective portion. The method includes forming, on the first insulating layer, a first electrode and a connection conductive layer. The connection conductive layer is connected to the first power supply line. The method includes covering an edge of the first electrode with a second insulating layer and stacking the second insulating layer on the masking unit. The method includes forming an emission layer and a second electrode on the first insulating layer. The second electrode is connected with the connection conductive layer. The method includes forming a first inorganic encapsulation layer on the second electrode. The method includes forming a dam unit on the first inorganic encapsulation layer. The method includes forming an organic encapsulation layer at an inner side of the dam unit facing away from the protective portion. The method includes forming a second inorganic encapsulation layer on the organic encapsulation layer. The method includes separating the masking unit from the substrate.

The dam unit may include a closed loop.

A hardening process may be performed after the forming of the organic encapsulation layer.

A height of the organic encapsulation layer may be greater than that of the dam unit.

The connection conductive layer, the first inorganic encapsulation layer, and the second inorganic encapsulation layer may be stacked on the first power supply line.

The method may further include forming a third insulating layer over a portion of the second insulating layer on the masking unit.

An entire thickness of the second insulating layer and the third insulating layer in a region in which the masking unit has been formed may be greater than a thickness of the second insulating layer in a region in which the emission layer has been formed.

The emission layer may be formed by a deposition method using a mask.

According to an exemplary embodiment of the present invention, an organic light-emitting display device includes a substrate including a display area and a peripheral area adjacent to the display area. A thin film transistor is disposed on the substrate in the display area. A power supply line is disposed on the substrate in the peripheral area. The power supply line is electrically connected with the thin film transistor. An organic insulating layer is formed on the thin film transistor. The organic insulating layer includes a protective portion disposed on an end of the power supply line opposite the display area. An encapsulation unit is disposed on the display area and overlaps a portion of the peripheral area. A dam unit is disposed in the encapsulation unit between the display area and the power supply line. The dam unit encloses a side surface of the encapsulation unit.

The encapsulation unit may include a first inorganic encapsulation layer, an organic encapsulation layer disposed on the first inorganic encapsulation layer and a second inorganic encapsulation layer disposed on the organic encapsulation layer.

The dam unit may be disposed between the first inorganic encapsulation layer and the second inorganic encapsulation layer. A side of the dam unit facing the display area may be in direct contact with the organic encapsulation layer.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
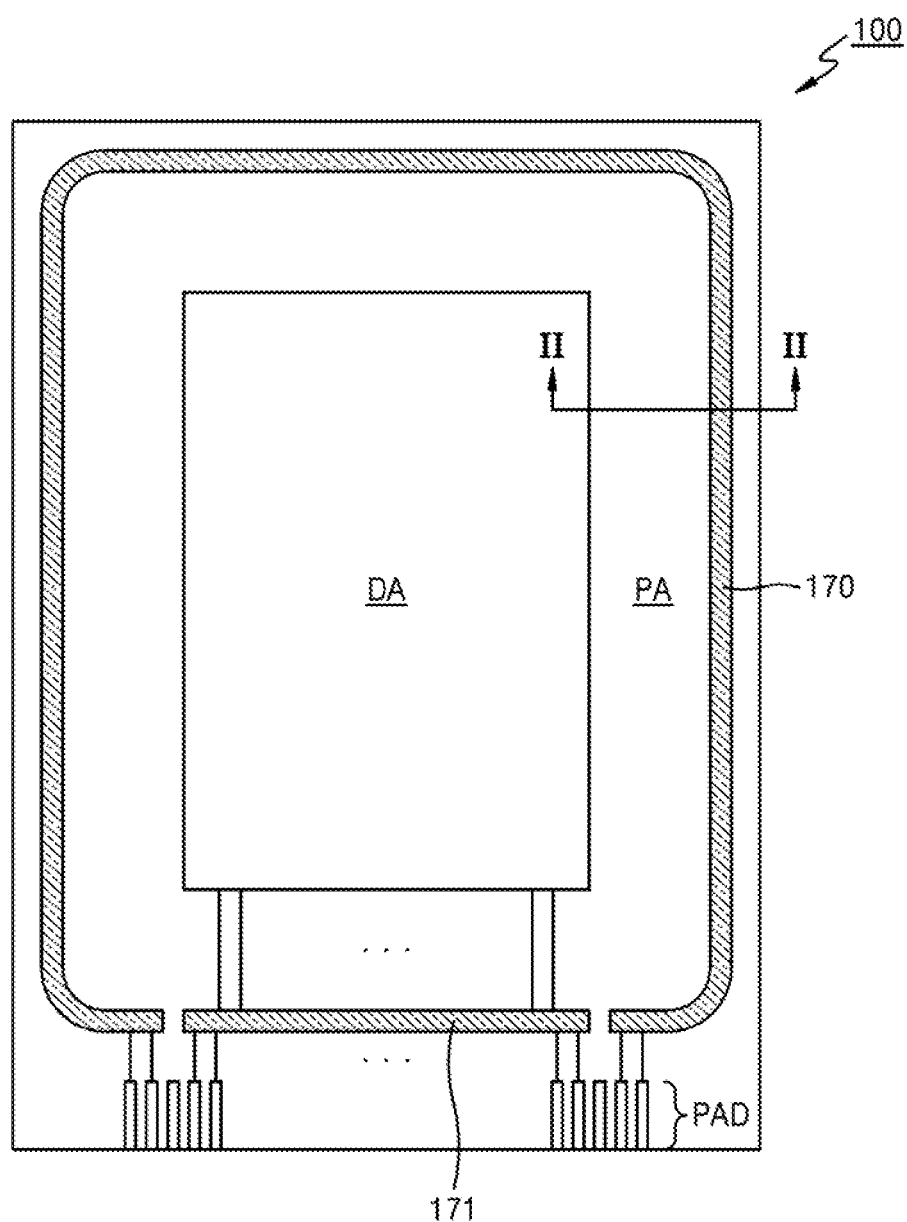
FIG. 1 is a plan view of a portion of an organic light-emitting display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

According to an exemplary embodiment of the present invention, an organic light-emitting display device which may prevent deterioration of display quality and reduce a dead space may be implemented. However, exemplary embodiments of the present invention are not limited thereto.

It will be understood that when a component, such as a layer, a film, a region, or a plate, is referred to as being "on" another component, the component may be directly on the other component or intervening components may be present. Sizes of elements (e.g., thicknesses of layers) in the drawings may be exaggerated for clarity of description.

Figure 2:
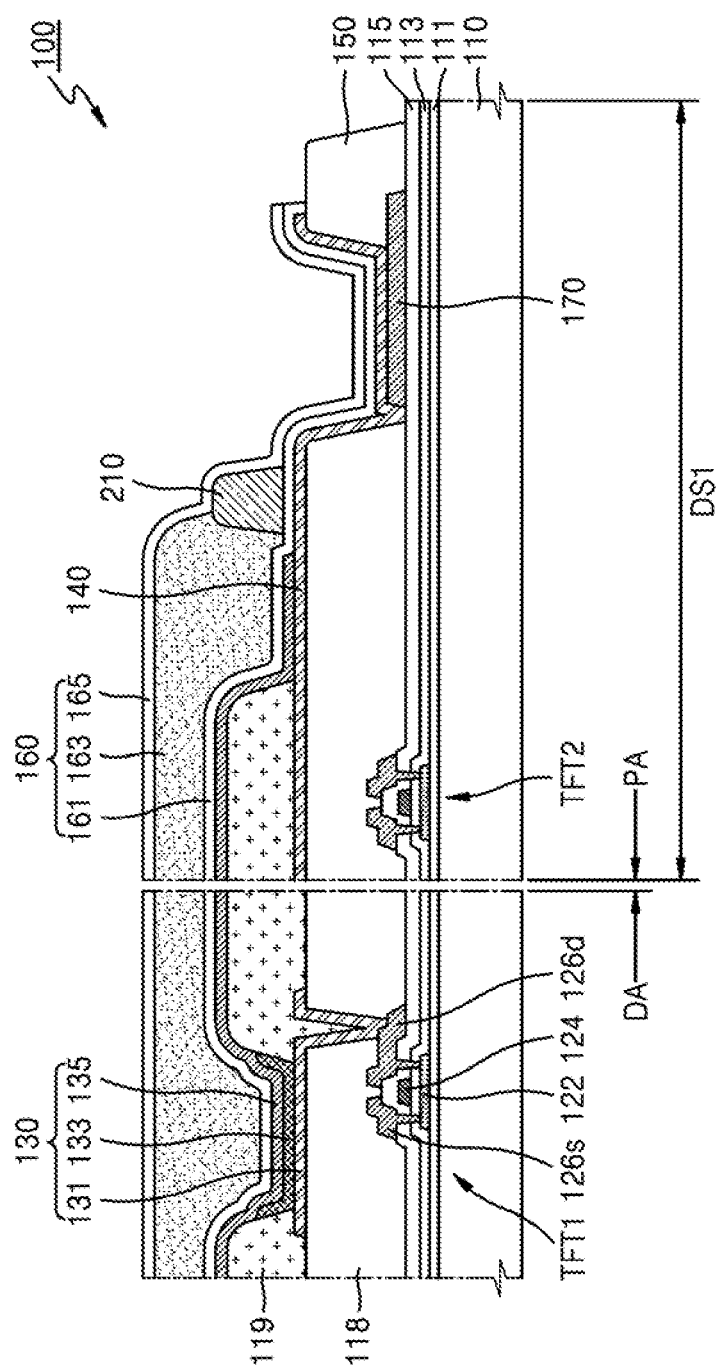
FIG. 2 is a cross-sectional view of a portion of the organic light-emitting display device of FIG. 1 taken along line II-II.

FIG. 1 is a plan view of a portion of an organic light-emitting display device according to an exemplary embodiment of the present invention. FIG. 2 is a cross-sectional view of a portion of the organic light-emitting display device taken along line II-II of FIG. 1.

Referring to FIGS. 1 and 2, an organic light-emitting display device 100 according to an exemplary embodiment of the present invention may include a display area DA and a peripheral area PA adjacent to the display area DA. The display area DA and the peripheral area DA may be defined in or above a substrate 110. The peripheral area PA may be a non-display area located outside the display area DA. As an example, the peripheral area PA may be arranged at four sides of the display area DA in a plan view; however, exemplary embodiments of the present invention are not limited thereto. For example, the peripheral area PA may be arranged at less than four sides (e.g., three sides) of the display area DA in a plan view.

A first power supply line 170 may be arranged outside the display area DA. A dam unit 210 may be adjacent to the first power supply line 170 such that the dam unit 210 is relatively close to the display area DA. For example, the dam unit 210 may be positioned between the first power supply line 170 and the display area DA (e.g., the dam unit 210 may be positioned in the peripheral area PA). A dead space of the organic light-emitting display device 100 may be reduced by arranging the dam unit 210 such that the dam unit 210 is relatively close to the display area DA.

The organic light-emitting display device 100 according an exemplary embodiment of the present invention is described in more detail below.

The substrate 110 may include various materials such as a glass material, a metal material, or a plastic material. For example, the substrate 110 may be a flexible substrate including polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). For example, the substrate 110 and the corresponding display device may be a bendable or foldable display device that is in a curved or bent state at some times and is in a substantially flat state at other times. Alternatively, the display device may be in a permanently folded, curved or bent state.

A plurality of first thin film transistors TFT1 and second thin film transistors TFT2, the first power supply line 170, and a second power supply line 171 may be arranged over the substrate 110.

A buffer layer 111 including an inorganic material such as silicon oxide, silicon nitride, and/or silicon oxynitride may be arranged between the first thin film transistor TFT1 and the substrate 110. The buffer layer 111 may be in direct contact with an upper surface of the substrate 110 facing the first thin film transistors TFT1. The buffer layer 111 may planarize an upper surface of the substrate 110. The buffer layer 111 may prevent or reduce penetration of impurities into a semiconductor layer 122 through the substrate 110.

The first thin film transistor TFT1 may include the semiconductor layer 122 including amorphous silicon, polycrystalline silicon, or an organic semiconductor material, a gate electrode 124, a source electrode 126*s*, and a drain electrode 126*d*.

The gate electrode 124 may be arranged over the semiconductor layer 122. The source electrode 126*s* may electrically communicate with the drain electrode 126*d* depending on a signal applied to the gate electrode 124. The gate electrode 124 may have a single layer structure or a multi-layer structure including, for example, at least one of Al, Pt, Pd, Ag, Mg, Au, Ni, Nd, Ir, Cr, Li, Ca, Mo, Ti, W, or Cu. The single or multi-layer structure and the materials included in the single layer or the layers of the multi-layer structure may be determined by taking into account tightness with an adjacent layer, a surface planarization characteristic of a stacked layer, or processability.

A gate insulating layer 113 including an inorganic material such as silicon oxide, silicon nitride, and/or silicon oxynitride may be arranged between the semiconductor layer 122 and the gate electrode 124, which may insulate between the semiconductor layer 122 and the gate electrode 124.

An interlayer insulating layer 115 including an inorganic material such as silicon oxide, silicon nitride, and/or silicon oxynitride may be arranged on the gate electrode 124, and the source electrode 126*s* and the drain electrode 126*d* may be arranged on the interlayer insulating layer 115. The source electrode 126*s* and the drain electrode 126*d* may be electrically connected to the semiconductor layer 122 through contact holes in the interlayer insulating layer 115 and the gate insulating layer 113, respectively.

The source electrode 126*s* and the drain electrode 126*d* may each have a single layer structure or a multi-layer structure including at least one of Al, Pt, Pd, Ag, Mg, Au, Ni, Nd, Ir, Cr, Li, Ca, Mo, Ti, W, or Cu.

The second thin film transistor TFT2 may be arranged in the peripheral area PA of the substrate 110. The second thin film transistor TFT2 may be a portion of a circuit unit configured to control an electric signal applied into the display area DA. The second thin film transistor TFT2 may have substantially the same structure as that of the first thin film transistor TFT1. For example, the second thin film transistor TFT2 may include a semiconductor layer including amorphous silicon, polycrystalline silicon, or an organic semiconductor material. Alternatively, the second thin film transistor TFT2 may have a structure different from that of the first thin film transistor TFT1.

The first power supply line 170 and the second power supply line 171 may each supply power to an organic light-emitting diode 130. The display device may include a plurality of light-emitting diodes 130, each of which may be supplied with power by the first power supply line 170 and/or the second power supply line 171. The plurality of light-emitting diodes 130 may be arranged in rows or columns on the substrate 110. For example, the plurality of light-emitting diodes 130 may be arranged in a matrix configuration on the substrate 110.

The first power supply line 170 may be a line configured to supply low voltage power, ELVSS. The first power supply line 170 may be connected to the second electrode 135 through a connection conductive layer 140 to apply the low voltage power to the organic light-emitting diode 130. The first power supply line 170 may include a same material as that of the source electrode 126*s* and the drain electrode 126*d* of the first thin film transistor TFT1 and the second thin film transistor TFT2.

The first power supply line 170 may surround the display area. For example, the first power supply line 170 may surround the display area DA in substantially a 'c' shape (e.g., in a plan view). However, exemplary embodiments of the present invention are not limited thereto. The first power supply line 170 may be arranged at any side of the display area DA. For example, the first power supply line 170 may be arranged at any one side of the display area DA in a plan view.

The second power supply line 171 may be a line configured to supply high voltage power, ELVDD. The second power supply line 171 may be directly connected to the display area DA to apply the high voltage power to the organic light-emitting diode 130.

A pad unit PAD connected to the first power supply line 170 and the second power supply line 171 may be connected to an external power supply unit.

In the display area DA and the peripheral area PA, a first organic insulating layer 118 may be arranged on the first thin film transistor TFT1 and the second thin film transistor TFT2.

In the case where the organic light-emitting diode 130 is arranged over the first thin film transistor TFT1, the first organic insulating layer 118 may serve as a planarization layer to allow the first electrode 131 to be flatly arranged on the first organic insulating layer 118. The first organic insulating layer 118 may include, for example, an organic material such as acrylic, benzocyclobutene (BCB), PI, or hexamethyldisiloxane (HMDSO). As an example, the first organic insulating layer 118 may include a single layer. However, alternatively, the first organic insulating layer 118 may include multiple layers and may be variously modified.

The first organic insulating layer 118 may be formed in the display area DA and the peripheral area PA. The first organic insulating layer 118 may be divided by a region in which the first power supply line 170 is arranged and the divided portion may form a protective portion 150 configured to cover an outer end of the first power supply line 170 (e.g., an end facing away from the display area DA). The protective portion 150 may prevent deterioration of the first power supply line 170 by cladding the outer end of the first power supply line 170 (e.g., during separation of a region of the peripheral area PA on a side of the protective portion 150 opposite the display area).

As an example, the first organic insulating layer 118 may include a same material as the protective portion 150, and the first inorganic insulating layer 118 and the protective portion may be formed by a single continuous process. The first organic insulating layer 118 and the protective portion 150 may be collectively referred to as a protective portion. The protective portion including the first organic insulating layer 118 and the protective portion 150 may include a first portion on the first thin film transistor TFT1 in the display area DA and may include a second portion on the first power supply line 170 in the peripheral area. For example, the second portion may be disposed on an end of the first power supply line 170 facing away from the display area DA.

In the display area DA, the organic light-emitting diode 130 may be arranged on the first organic insulating layer 118. The organic light-emitting diode 130 may include the first electrode 131, the second electrode 135, and an intermediate layer 133 arranged therebetween and including an emission layer. Thus, the intermediate layer 133 may be interchangeably referred to herein as an emission layer.

The first electrode 131 may include a transparent electrode or a reflective electrode.

In the case where the first electrode 131 includes a transparent electrode, the first electrode 131 may include a transparent conductive layer. The transparent conductive layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In this case, the first electrode 131 may further include a transflective layer configured to increase light efficiency in addition to the transparent conductive layer. The transflective layer may include a thin layer ranging from several nm to tens of nm, the thin layer including at least one of Ag, Mg, Al, Pt, Pd, Au, Ni, Nd, Ir, Cr, Li, Ca, of Yb.

In the case where the first electrode 131 includes a reflective electrode, the first electrode 131 may include a reflective layer and a transparent conductive layer, the reflective layer including at least one of Ag, Mg, Al, Pt, Pd, Au, Ni, Nd, Ir, Cr, or a compound thereof, the transparent conductive layer being arranged on and/or under the reflective layer. The transparent conductive layer may include at least one of ITO, IZO, ZnO, $In_2O_3$, IGO, or AZO.

However, exemplary embodiments of the present invention are not limited to the examples described above, and the first electrode 131 may include various materials, and a structure thereof may include a single layer or multiple layers and various modifications may be made.

A second organic insulating layer 119 may be arranged on the first organic insulating layer 118 (e.g., over the display area DA and the peripheral area PA).

A first opening 119a (see, e.g., FIG. 5B) of the second organic insulating layer 119 may expose a central portion of the first electrode 131 and may define a pixel. The second organic insulating layer 119 may cover an edge of the first electrode 131 and prevent arc generation at an edge of the first electrode 131.

The second organic insulating layer 119 may include an organic material such as PI or HMDSO. The second organic insulating layer 119 may include a material which is the same as or different from that of the first organic insulating layer 118.

The intermediate layer 133 of the organic light-emitting diode 130 may include a relatively low molecular weight material or a polymer material.

In the case where the intermediate layer 133 includes a relatively low molecular weight material, the intermediate layer 133 may have a structure in which a hole injection layer (HIL), a hole transport layer (HTL), an emission layer (EML), an electron transport layer (ETL), or an electron injection layer (EIL) are stacked in a single or a composite configuration, and may include various organic materials such as copper phthalocyanine (CuPc), N,N'-Di(naphthalene-1-yl)-N,N'-diphenyl-benzidine (NPB), or tris-8-hydroxyquinoline aluminum (Alq3).

In the case where the intermediate layer 133 includes a polymer material, the intermediate layer 133 may have a structure including the HTL and the EML. In this case, the HTL may include PEDOT, and the EML may include a polymer material such as polyphenylene vinylene (PPV)-based material and a polyfluorene-based material.

The intermediate layer 133 may be a layer provided over a plurality of first electrodes 131, and may include a layer patterned to correspond to each of the first electrodes 131.

The second electrode 135 may be provided over the display area DA and the peripheral area PA. The second electrode 135 may serve as a common electrode (e.g., may be provided as one body) over the first electrodes 131 of the organic light-emitting diodes 130.

The second electrode 135 may include a transparent electrode or a reflective electrode.

In the case where the second electrode 135 includes a transparent electrode, the second electrode 135 may include at least one of Ag, Al, Mg, Li, Ca, Cu, LiF/Ca, LiF/Al, MgAg, or CaAg, and may include a thin layer having a thickness ranging from several nm to tens of nm.

In the case where the second electrode 135 includes a reflective electrode, the second electrode 135 may include at least one of Ag, Al, Mg, Li, Ca, Cu, LiF/Ca, LiF/Al, MgAg, or CaAg. A construction and a material of the second electrode 135 are not limited to the examples described above and may be modified variously.

As an example, a capping layer configured to increase light efficiency and protect the light-emitting diode 130 may be provided over the second electrode 135.

For example, to increase light efficiency, the capping layer may include at least one of an organic material or an inorganic material among $SiO_2$, SiNx, $ZnO_2$, $TiO_2$, $ZrO_2$, ITO, IZO, Alq3, CuPc, CBP, a-NPB, or $ZiO_2$. Also, the capping layer may generate a plasmon resonance phenomenon with respect to light generated by the organic light-emitting diode 130. For example, the capping layer may include nano particles. Also, the capping layer may include an epoxy-based material including at least one of a bisphenol-type epoxy resin, an epoxidized butadiene resin, a fluorine-type epoxy resin, or a novolac epoxy resin.

The connection conductive layer 140 including a same material as that of the first electrode 131 may be arranged in the peripheral area PA. An end of the connection conductive layer 140 may be arranged on the first organic insulating layer 118. The connection conductive layer 140 may extend along a lateral surface of an opening 118b (see, e.g., FIG. 5B) in the first organic insulating layer 118, and may be arranged such that the connection conductive layer 140 is connected to the first power supply line 170. For example, the connection conductive layer 140 may overlap the first power supply line 170, and an outermost end of the connection conductive layer 140 may extend to an upper surface of the protective portion 150 covering an end of the first power supply line 170. As an example, the connection conductive layer 140 may cover a side surface of the protective portion 150 facing the display area DA. The connection conductive layer 140 may partially cover an upper surface of the protective portion 150 facing away from the substrate 110, and may expose a portion of the upper surface of the protective portion 150. The connection conductive layer 140 may also expose a side surface of the protective portion 150 facing away from the display area DA.

The second electrode 135 may extend to the peripheral area PA to directly contact the connection conductive layer 140 on the first organic insulating layer 118. Thus, the connection conductive layer 140 may be connected to the first power supply line 170 configured to supply power to the second electrode 135.

An encapsulation unit 160 including at least one inorganic layer and at least one organic layer may be arranged on the second electrode 135.

The encapsulation unit 160 may substantially cover the display area DA and may extend to the peripheral area PA. The encapsulation unit 160 may include a first inorganic encapsulation layer 161, an organic encapsulation layer 163, and a second inorganic encapsulation layer 165.

The first inorganic encapsulation layer 161 may substantially cover the second electrode 135 or the capping layer, and may include silicon oxide, silicon nitride, and/or silicon oxynitride. A layer including LiF may be arranged between the first inorganic encapsulation layer 161 and the capping layer.

When the first inorganic encapsulation layer 161 is provided along a structure thereunder, an upper surface of the first inorganic encapsulation layer 161 need not be flat. When the organic encapsulation layer 163 substantially covers the non-flat first inorganic encapsulation layer 161, an upper surface of the organic encapsulation layer 163 may be substantially flat. The organic encapsulation layer 163 may include at least one of PET, PEN, PC, PI, polyethylene sulfonate, polyoxymethylene, polyarylate, PAR, or HMDSO.

The second inorganic encapsulation layer 165 may substantially cover the organic encapsulation layer 163, and may include silicon oxide, silicon nitride, and/or silicon oxynitride. The second inorganic encapsulation layer 165 may allow the organic encapsulation layer 163 not to be exposed outside the organic light-emitting display device 100 by contacting the first inorganic encapsulation layer 161 in an edge region of the organic light-emitting display device 100.

In an exemplary embodiment of the present invention, since the encapsulation unit 160 includes the first inorganic encapsulation layer 161, the organic encapsulation layer 163, and the second inorganic encapsulation layer 165, even if a crack occurs in a layer of the encapsulation unit 160, the crack might not be transmitted to other layers of the encapsulation unit 160. For example, it may be prevented through this multi-layered structure, that the crack generated between the first inorganic encapsulation layer 161 and the organic encapsulation layer 163, or between the organic encapsulation layer 163 and the second inorganic encapsulation layer 165 is connected. Thus, a formation of a path through which external moisture or oxygen penetrates into the display area DA may be prevented or reduced.

A dam unit 210 may be arranged in the peripheral area. The dam unit 210 may be configured to control a flow phenomenon of the organic encapsulation layer 163.

When viewed from above the substrate 110 (e.g., in a plan view), the dam unit 210 may be arranged as a closed loop shape between the first inorganic encapsulation layer 161 and the second inorganic encapsulation layer 165. For example, the closed loop shape may surround the organic encapsulation layer 163 in a plan view. When viewed from above the substrate 110 (e.g., in a plan view), the dam unit 210 may be arranged such that the dam unit 210 is closer to the display area DA than the first power supply line 170, and is arranged over the first organic insulating layer 118. Therefore, a bottom surface of the dam unit 210 may be in direct contact with the first inorganic encapsulation layer 161, a top surface of the dam unit 210 may be in direct contact with the second inorganic encapsulation layer 165, an inner surface of the closed loop of the dam unit 210 may be in direct contact with the organic encapsulation layer 163, and an outer surface of the closed loop of the dam unit 210 may be in direct contact with the second inorganic encapsulation layer 165.

In an exemplary embodiment of the present invention, since the dam unit 210 is arranged such that the dam unit 210 is closer to the display area DA than the first power supply line 170, a dead space of the organic light-emitting display device 100 may be reduced. Thus, a size of the display device described herein may be reduced.

According to an exemplary embodiment of the present invention, an organic light-emitting display device may include the substrate 110 including the display area DA and the peripheral area PA adjacent to the display area DA. The thin film transistor TFT1 may be disposed on the substrate 110 in the display area DA. The power supply line 170 may be disposed on the substrate 110 in the peripheral area PA. The power supply line 170 may be electrically connected with the thin film transistor TFT1. The organic insulating layer 118 may be formed on the thin film transistor TFT1. The organic insulating layer 118 may include the protective portion 150 disposed on an end of the power supply line 170 opposite the display area DA. The encapsulation unit 160 may be disposed on the display area DA and may overlap a portion of the peripheral area PA. The dam unit 210 may be disposed in the encapsulation unit 160 between the display area DA and the power supply line 170. The dam unit 210 may enclose a side surface of the encapsulation unit 160.

The encapsulation unit 160 may include the first inorganic encapsulation layer 161, the organic encapsulation layer 163 disposed on the first inorganic encapsulation layer 161 and the second inorganic encapsulation layer 165 disposed on the organic encapsulation layer 163.

The dam unit 210 may be disposed between the first inorganic encapsulation layer 161 and the second inorganic encapsulation layer 165. A side of the dam unit 210 facing the display area DA may be in direct contact with the organic encapsulation layer 163.

The reduced size of the dead space is described in more detail below with reference to a comparative example.

Figure 3:
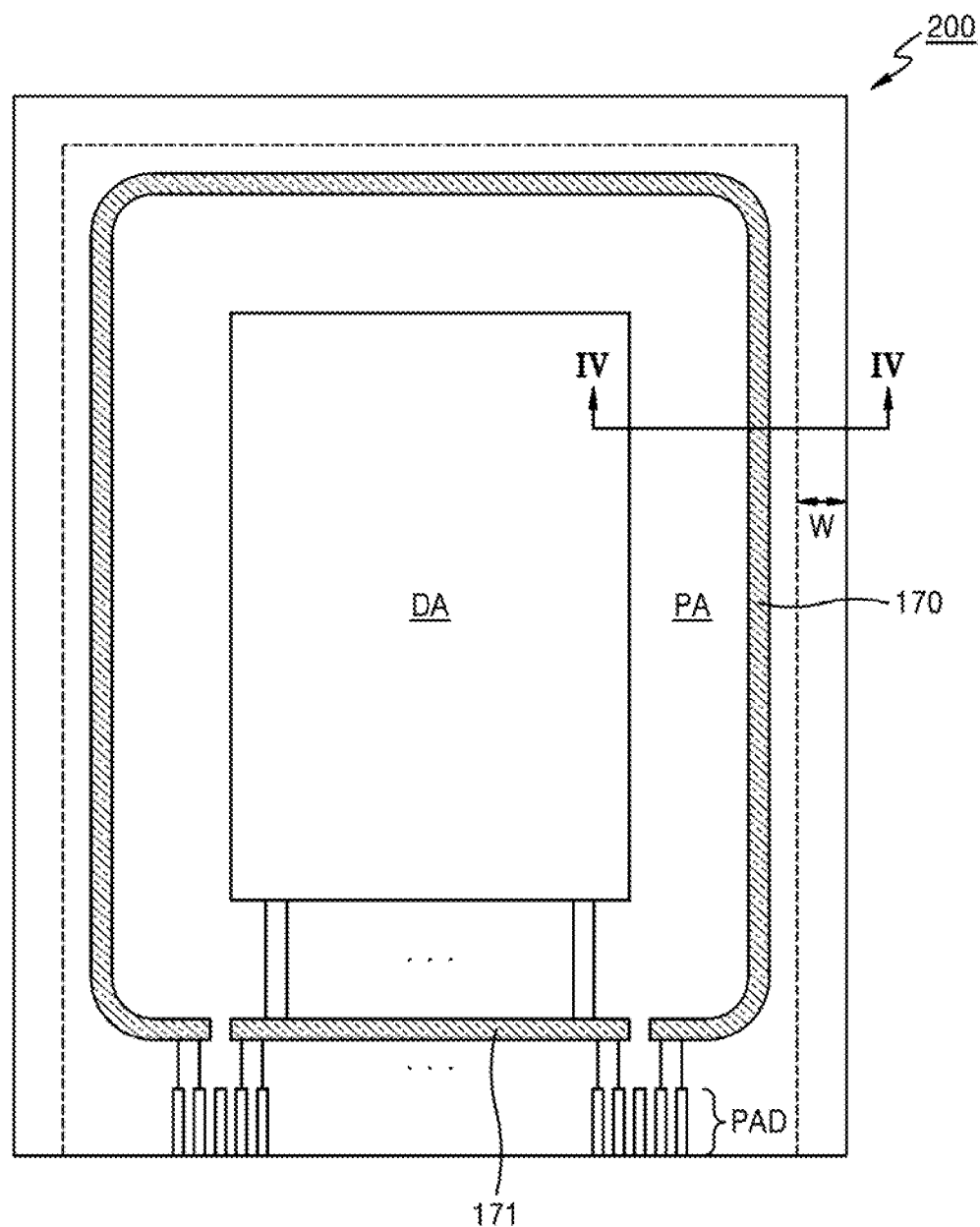
FIG. 3 is a plan view of a portion of an organic light-emitting display device according to a comparative example.
Figure 4:
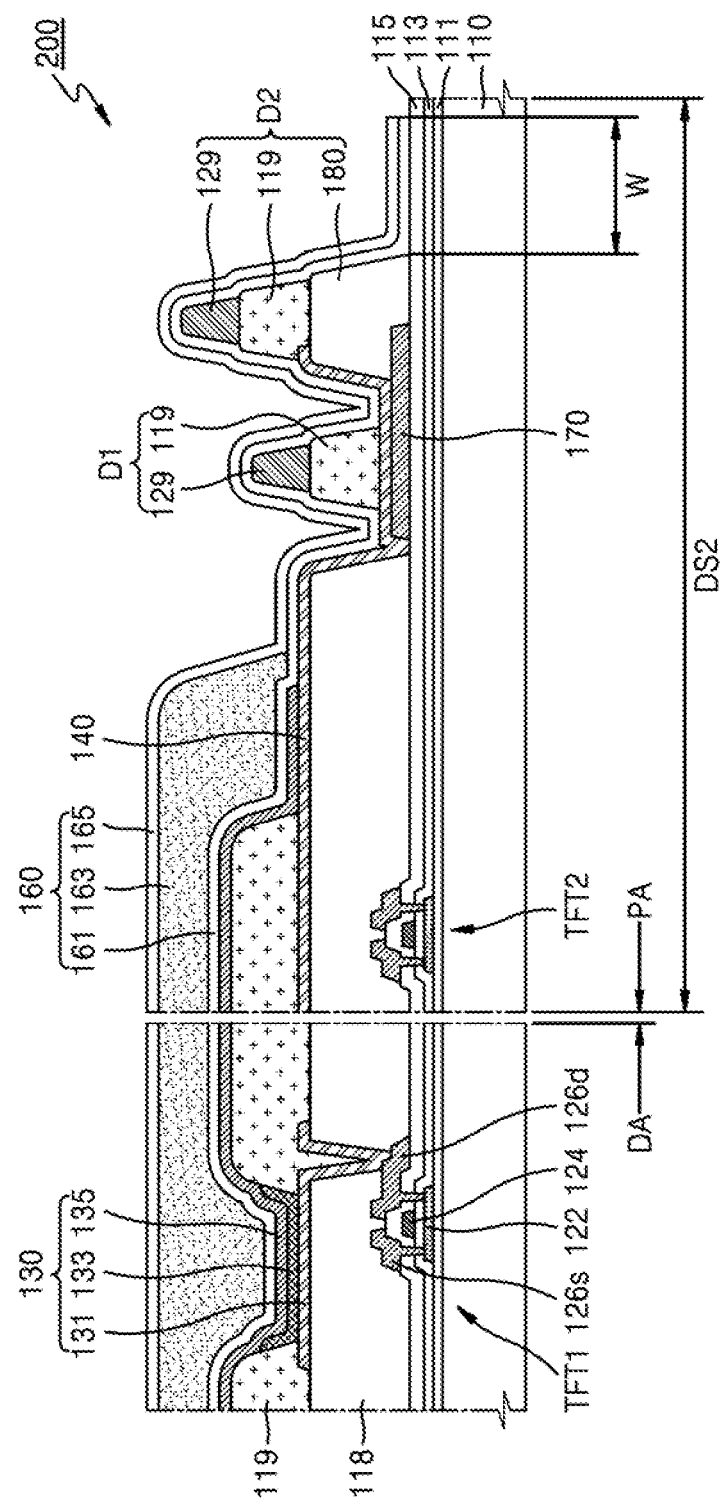
FIG. 4 is a cross-sectional view of a portion of the organic light-emitting display device taken along line IV-IV of FIG. 3.

FIG. 3 is a plan view of a portion of an organic light-emitting display device according to a comparative example. FIG. 4 is a cross-sectional view of a portion of the organic light-emitting display device taken along line IV-IV of FIG. 3.

Description is made with reference to FIGS. 3 and 4 which are comparative examples. The same reference numerals may denote the same elements as those of the above described exemplary embodiments. Thus, differences between exemplary embodiments of the present invention and the comparative examples may be focused on below.

Referring to FIGS. 3 and 4, an organic light-emitting display device 200 according to a comparative example includes a display area DA in the substrate 110 and a peripheral area PA, which is a non-display area, located outside the display area DA. The first power supply line 170 and a second power supply line are provided to the peripheral area PA.

Compared with the organic light-emitting display device 100 described herein (e.g., with reference to FIG. 1), a distance between the first power supply line 170 and the substrate 110 in the organic light-emitting display device 200 of FIG. 3 is wider by a width W. Thus, a dead space of the organic light-emitting display device 200 of FIG. 3 is wider than that of the organic light-emitting display device 100 of FIG. 1.

For example, a first dam unit D1 is arranged over the first power supply line 170, and a second dam unit D2 is arranged outside the first dam unit D1.

The second dam unit D2 includes a masking unit 180 covering an end of the first power supply line 170, the second organic insulating layer 119 stacked on the masking unit 180, and a third organic insulating layer 129 stacked on the second organic insulating layer 119.

The second dam unit D2 may prevent deterioration of the first power supply line 170 during a backplane manufacturing process, which uses chemicals, by covering the end of the first power supply line 170. The second dam unit D2 is provided for preventing a metal mask from damaging a surface of the second electrode 135 while the encapsulation unit 160 is formed by a deposition process by using the metal mask during a manufacturing process of the encapsulation unit 160. The second dam unit D2 covers the end of the first power supply line 170 in the outer side of the substrate 110.

The first dam unit D1 includes the second organic insulating layer 119 over the first power supply line 170, and the third organic insulating layer 129 stacked on the second organic insulating layer 119. The first dam unit D1 prevents flowing of an organic monomer generated during a process of depositing the organic monomer, which is a composition for forming an organic polymer configuring the organic encapsulation layer 163, among deposition processes of the encapsulation unit 160.

In the comparative example, since the first dam unit D1 is arranged over the first power supply line 170, a section of the substrate 110 in which only inorganic layers are arranged is designed in an outer portion of the substrate 110. In FIG. 4, in a section W outside the second dam unit D2, the buffer layer 111, the gate insulating layer 113, the interlayer insulating layer 115, the first inorganic encapsulation layer 161, and the second inorganic encapsulation layer 165 are sequentially stacked on the substrate 110. To prevent moisture or oxygen from penetrating into the display area DA, the comparative example includes section W in which only the inorganic materials are stacked. However, a dead space increases due to the section W.

When a dead space DS2 (see, e.g., FIG. 4) of the comparative example is compared with a dead space DS1 (see, e.g., FIG. 2) of an exemplary embodiment of the present invention, the dead space DS1 may be reduced by the section W compared with the dead space DS2 of the comparative example. The reduction in the dead space in the organic light-emitting display device 100 described above may result from the arrangement of the dam unit 210 according to an exemplary embodiment of the present invention, such that the dam unit 210 is relatively closer to the display area DA than the first power supply line 170 in the organic light-emitting display device 100 compared with the organic light-emitting display device 200 according to a comparative example.

According to an exemplary embodiment of the present invention, a material having a relatively large surface energy difference with respect to an organic monomer as a material of the dam unit 210 may be employed instead of using materials of the second organic insulating layer 119 and the third organic insulating layer 129 like the above comparative example. For example, a self-assembled monolayer or silicon may be included in the dam unit 210 according to an exemplary embodiment of the present invention. In an exemplary embodiment of the present invention, since a self-assembled monolayer or silicon may generate a difference in wettability due to a surface energy difference with respect to the organic monomer, the self-assembled monolayer or silicon may prevent flowing of the organic monomer.

In this case, a thickness of the dam unit 210 according to an exemplary embodiment of the present invention might not be greater than a thickness of the organic encapsulation layer 163. Due to a difference in wettability between the material of the dam unit 210 and the organic monomer, the organic monomer might not overflow from the dam unit 210. The organic monomer according to an exemplary embodiment of the present invention may be hardened before the organic monomer overflows from the dam unit 210.

Since the dam unit 210 according to an exemplary embodiment of the present invention is not arranged over the first power supply line 170 and is arranged such that the dam unit 210 is closer to the display area DA, the connection conductive layer 140, the first inorganic encapsulation layer 161, and the second inorganic encapsulation layer 165, which might all be inorganic layers, may be stacked on the first power supply line 170 without an organic layer. Therefore, since the section W in which only the inorganic layers are stacked like the comparative example may be omitted or removed, the dead space may be reduced by the section W.

A manufacturing method according to an exemplary embodiment of the present invention will be described in more detail below with reference to FIGS. 5A to 5H. FIGS. 5A, 5B, 5C, 5D, 5E, 5F, 5G and 5H are cross-sectional views of a method of manufacturing an organic light-emitting display device, according to an exemplary embodiment of the present invention. The descriptions of the components and layers of the organic light-emitting display device above with reference to FIGS. 1 and 2 may be applicable to the organic light-emitting display device described below with reference to FIGS. 5A to 5H.

Figure 5A:
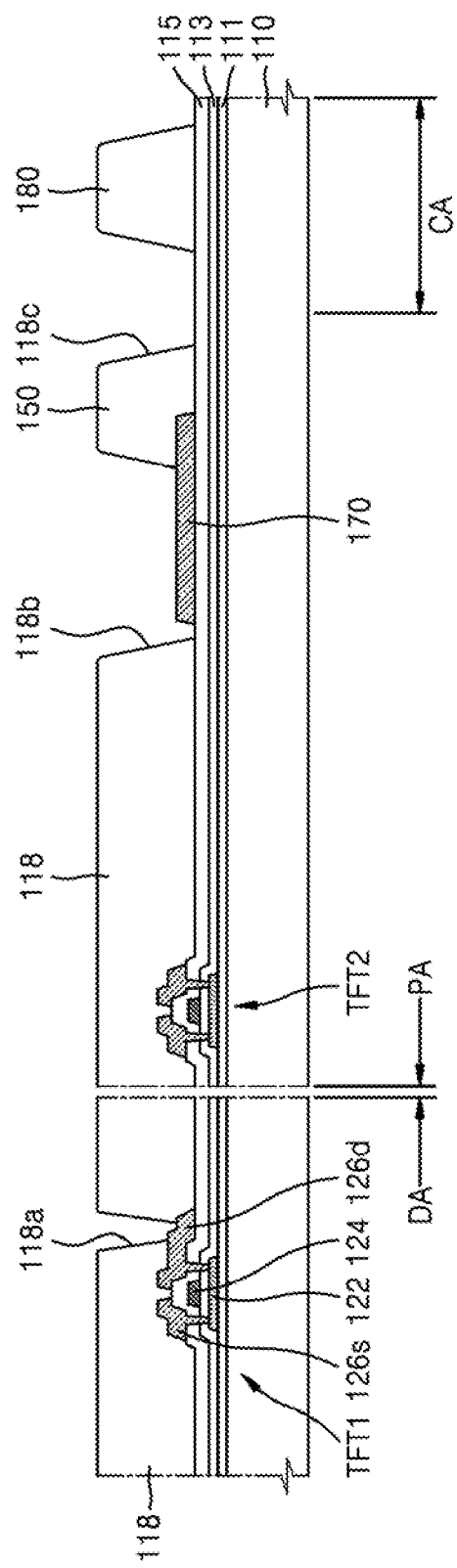
FIGS. 5A, 5B, 5C, 5D, 5E, 5F, 5G and 5H are cross-sectional views of a method of manufacturing an organic light-emitting display device, according to an exemplary embodiment of the present invention.

Referring to FIG. 5A, the buffer layer 111 may be formed in the display area DA and the peripheral area PA of the substrate 110. The buffer layer 111 may be in direct contact with the substrate 110. The semiconductor layers 122 of the first thin film transistor TFT1 and the second thin film transistor TFT2 may be formed on the buffer layer 111.

The gate insulating layer 113 may be formed on the semiconductor layer 122, and the interlayer insulating layer 115 may be formed on the gate insulating layer 113. For example, the buffer layer 111, the gate insulating layer 113, and the interlayer insulating layer 115 may each have a single layer or a multi-layer structure including an inorganic material such as silicon oxide, silicon nitride, and/or silicon oxynitride.

The source electrode 126s and the drain electrode 126d may be formed on the interlayer insulating layer 115. While the source electrode 126s and the drain electrode 126d are formed, the first power supply line 170 may be formed in the peripheral area PA by using a same material as that of the source electrode 126s and the drain electrode 126d.

After forming the first organic insulating layer 118 (e.g., to cover the first thin film transistor TFT1 and the second thin film transistor TFT2), and the first power supply line 170, by forming a first opening 118a exposing the drain electrode 126d of the first thin film transistor TFT1, a second opening 118b exposing a portion of the first power supply line 170, and a third opening 118c exposing a portion between the first power supply line 170 and an end of the substrate 110, the protective portion 150 disposed on (e.g., covering) an end of the first power supply line 170 opposite the display area, and a masking unit 180 spaced apart from the protective portion 150 may be formed.

Figure 5B:
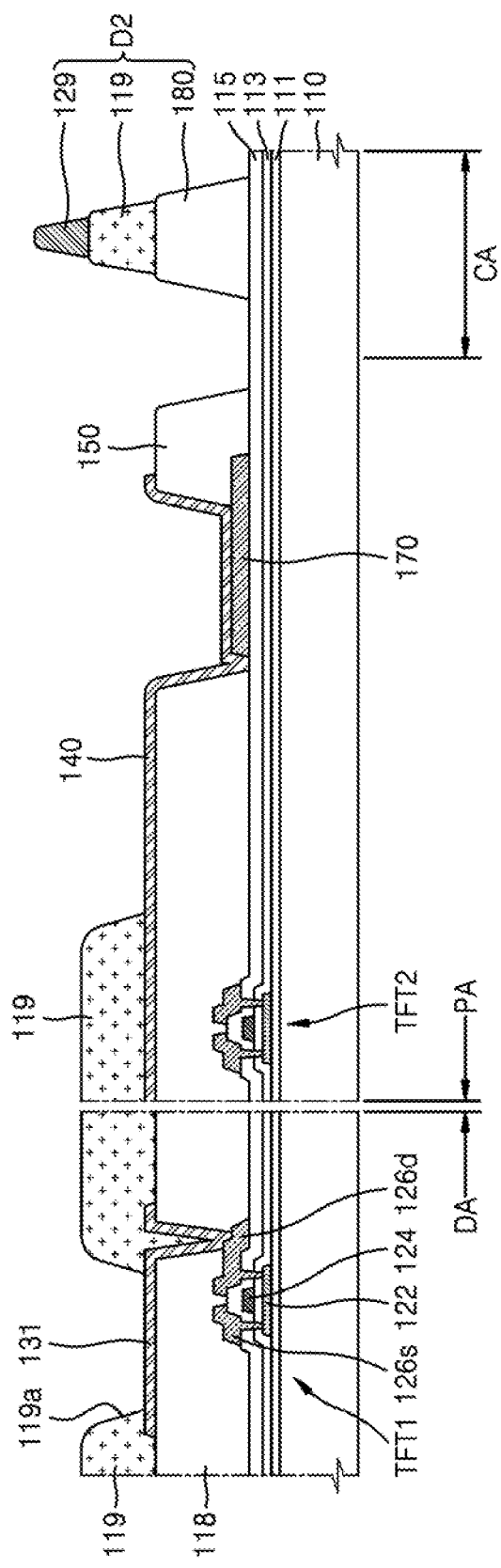

Referring to FIG. 5B, the connection conductive layer 140 connected to the first electrode 131 and the first power supply line 170 may be formed on the first organic insulating layer 118. The connection conductive layer 140 may overlap the first power supply line 170, and an end of the connection conductive layer 140 may extend to an upper surface of the protective portion 150 (e.g., a portion of the protective portion covering an end of the first power supply line 170 opposite the display area).

The second organic insulating layer 119 may be formed on the first organic insulating layer 118, an opening 119a configured to expose a central portion of the first electrode 131 may be formed, and the second organic insulating layer 119 may be stacked on the masking unit 180.

The masking unit 180, the second organic insulating layer 119, and the third organic insulating layer 129 may be included in the second dam unit D2. The second dam unit D2 according to an exemplary embodiment of the present invention may have substantially the same structure as that of the second dam unit D2 of the above described comparative example (see, e.g., D2 of FIG. 4).

The third organic insulating layer 129 may include a same material as that of the second organic insulating layer 119. The third organic insulating layer 129 may be formed during the same mask process as that of the second organic insulating layer 119. Alternatively, the third organic insulating layer 129 may include a material different from that of the second organic insulating layer 119, and may be formed during a mask process different from that of the second organic insulating layer 119. As an example, the third organic insulting layer 129 may include a same material as that of a spacer configured to prevent damage to a pixel while the encapsulation unit 160 is deposited, and may be formed during the same process as that of the spacer.

Figure 5C:
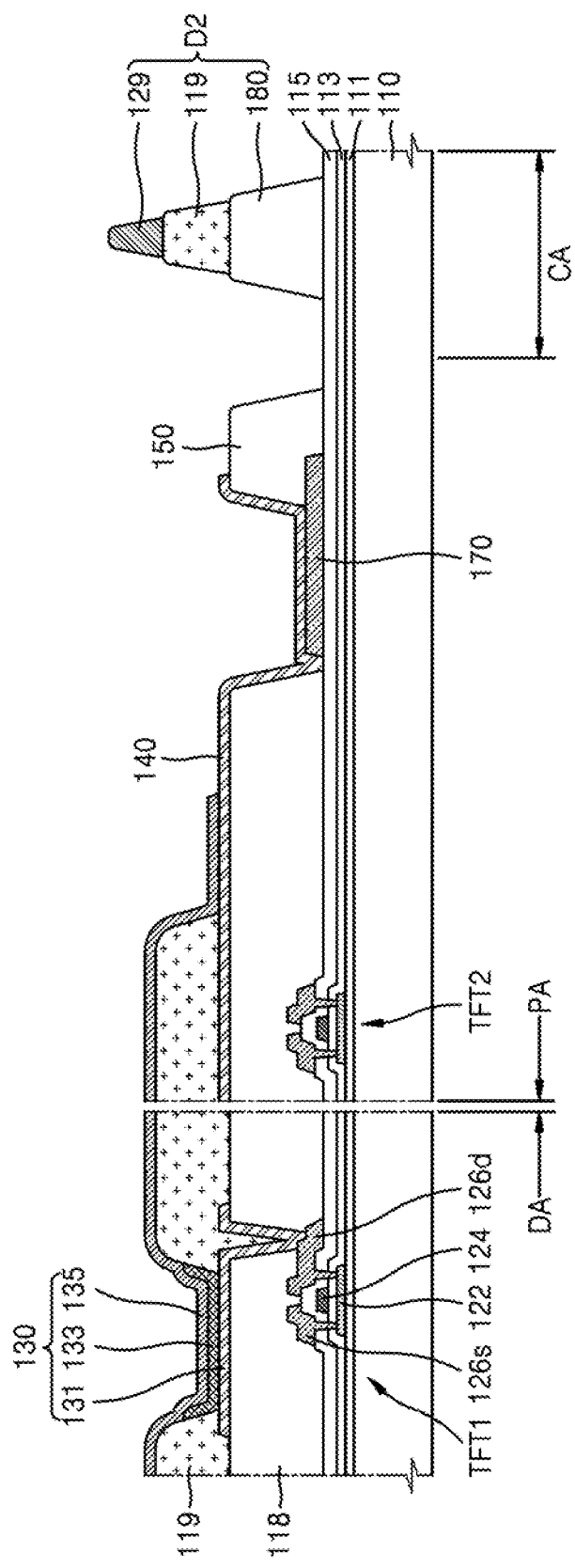

Referring to FIG. 5C, the intermediate layer 133 including the emission layer, and the second electrode 135 may be formed.

As an example, the intermediate layer 133 may be formed in an area corresponding to one first electrode 131. However, exemplary embodiments of the present invention are not limited thereto and the intermediate layer 133 may be formed over a plurality of first electrodes 131.

The second electrode 135 may be formed in common over a plurality of pixels, may extend to the peripheral area PA, and may be in direct contact with the connection conductive layer 140 on the first organic insulating layer 118. The connection conductive layer 140 may be connected to the first power supply line 170 and may supply power to the organic light-emitting diode 130.

Figure 5D:
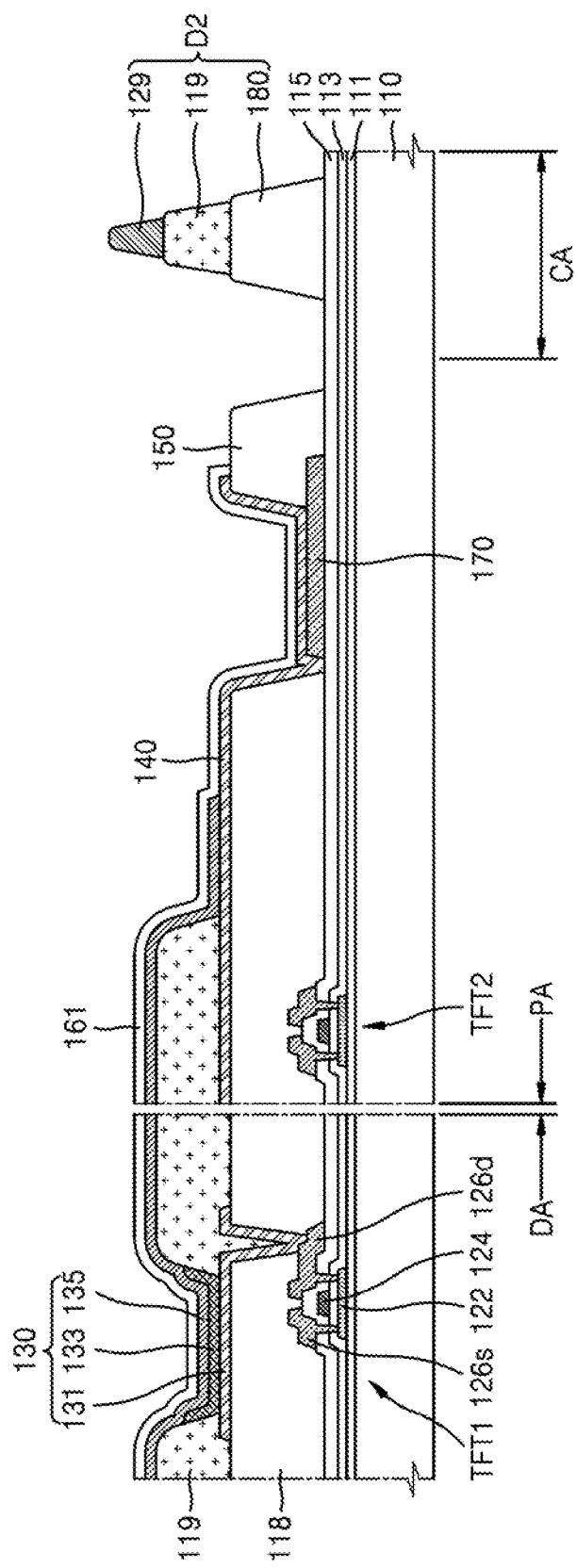

Referring to FIG. 5D, the first inorganic encapsulation layer 161 may be formed.

The first inorganic encapsulation layer 161 may substantially cover the second electrode 135 or the capping layer, may extend to the peripheral area PA to substantially cover the first power supply line 170, and may substantially cover a portion of the protective portion 150.

The first inorganic encapsulation layer 161 may include an inorganic material including silicon oxide, silicon nitride, and/or silicon oxynitride, and may be formed by a deposition process.

In an exemplary embodiment of the present invention, since the first inorganic encapsulation layer 161 is formed along a structure thereunder, an upper surface thereof need not be flat. The organic encapsulation layer 163 may allow an upper surface thereof to be substantially flat by covering the non-flat first inorganic encapsulation layer 161. The organic encapsulation layer 163 may include at least one of PET, PEN, PC, PI, polyethylene sulfonate, polyoxymethylene, polyarylate, PAR, or HMDSO, and may be formed by a deposition process.

Figure 5E:
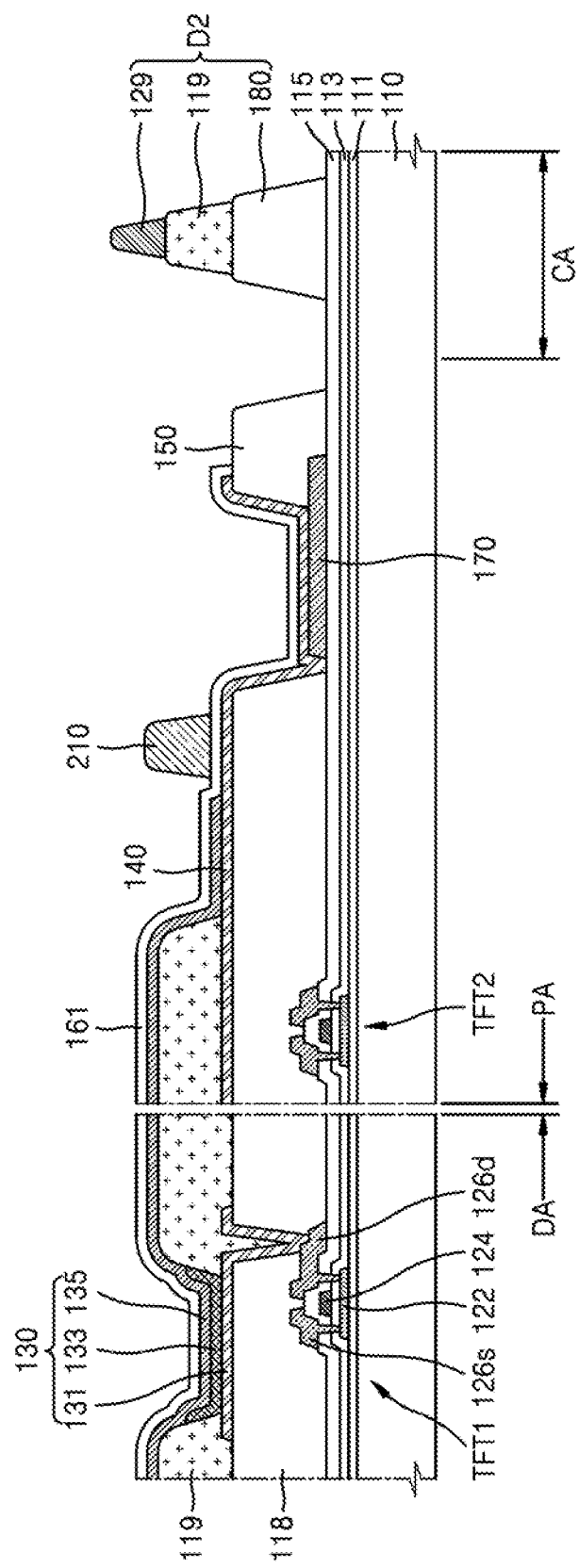

Referring to FIG. 5E, the dam unit 210 may be formed on the first inorganic encapsulation layer 161.

The dam unit 210 may be arranged as a closed loop shape on the first inorganic encapsulation layer 161 in the peripheral area PA. When viewed from a horizontal direction of the substrate 110 (e.g., in a plan view), the dam unit 210 may be arranged such that the dam unit 210 is closer to the display area DA than the first power supply line 170.

The dam unit 210 may include a material having a relatively large surface energy difference with respect to the organic monomer which is a composition which may be included in the organic encapsulation layer 163 described below. For example, a self-assembled monolayer or silicon may be included in the dam unit 210.

Figure 5F:
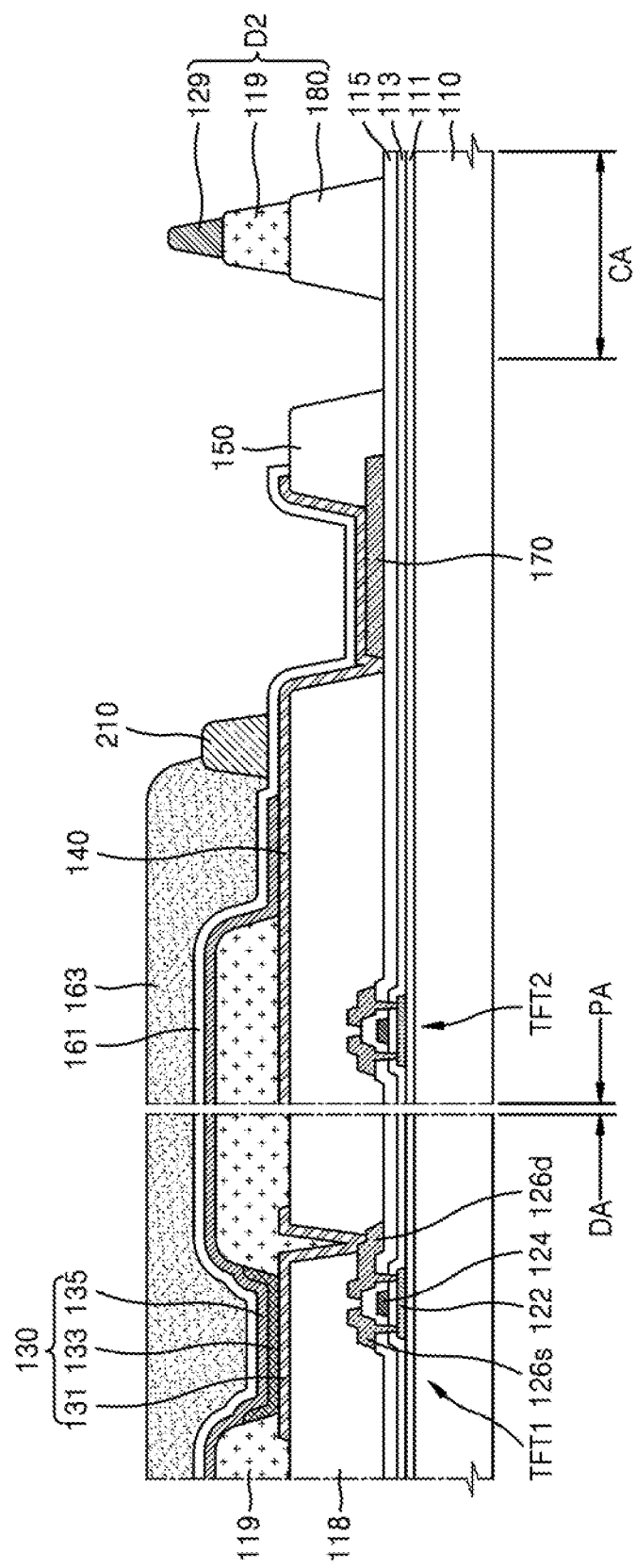

Referring to FIG. 5F, the organic encapsulation layer 163 may be formed inside the dam unit 210. For example, the encapsulation layer may be formed between the dam unit 210 and the display area DA and may substantially cover the display area DA.

In an exemplary embodiment of the present invention, since the organic encapsulation layer 163 substantially covers the non-flat first inorganic encapsulation layer 161, an upper surface of the organic encapsulation layer 163 may be substantially flat. The organic encapsulation layer 163 may include at least one of PET, PEN, PC, PI, polyethylene sulfonate, polyoxymethylene, polyarylate, PAR, or HMDSO. As an example, before the organic encapsulation layer 163 is formed (e.g., including an organic polymer), the organic encapsulation layer 163 may be deposited on the first inorganic encapsulation layer 161 as an organic monomer, which is a composition for forming a polymer, and passes through a hardening process. In this case, since the organic monomer may have a relatively small amount of fluidity, a flow phenomenon may occur. The dam unit 210 may be formed around the organic monomer, and thus a flow of the organic monomer outside the dam unit 210 may be prevented. In an exemplary embodiment of the present invention, since the dam unit 210 includes a material having a relatively large surface energy difference with respect to the organic monomer, even though the dam unit 210 is arranged such that the dam unit 210 is closer to the display area DA than the comparative example, the flow phenomenon may be prevented.

Figure 5G:
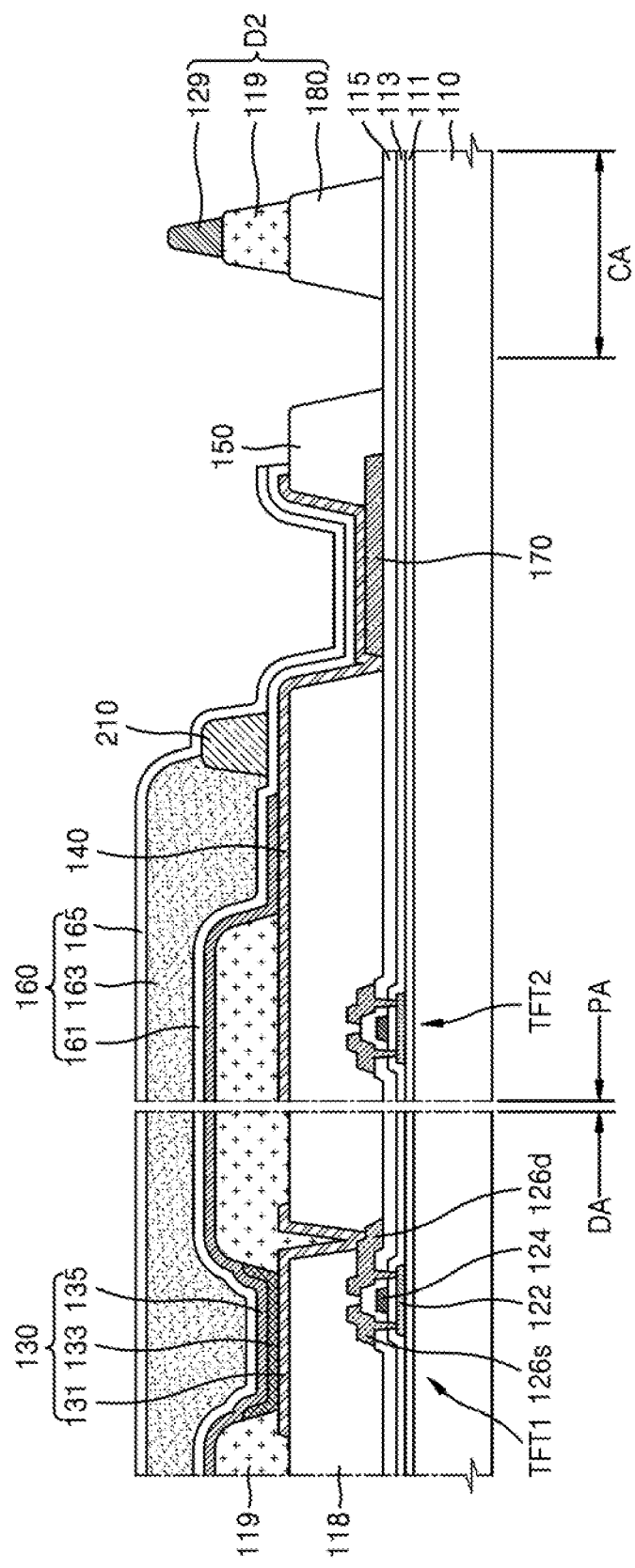

Referring to FIG. 5G, the second inorganic encapsulation layer 165 may be arranged on the organic encapsulation layer 163.

The second inorganic encapsulation layer 165 may substantially cover the organic encapsulation layer 163, may extend to the peripheral area PA, and may be stacked on the first inorganic encapsulation layer 161 in a region overlapping the first power supply line 170. The second inorganic encapsulation layer 165 may include an inorganic material such as silicon oxide, silicon nitride, and/or silicon oxynitride, and may be formed by a deposition process.

When the second dam unit D2 is formed by a deposition process using a metal mask during a manufacturing process while the encapsulation unit 160 is deposited, this may prevent the metal mask from damaging a surface of the second electrode 135.

When compared with the comparative example of FIG. 4, the second dam unit D2 according to an exemplary embodiment of the present invention might not cover an end of the first power supply line 170 and may be spaced apart from the first power supply line 170 by a preset interval. According to an exemplary embodiment of the present invention, the protective portion 150 may substantially cover an end of the first power supply line 170.

Figure 5H:
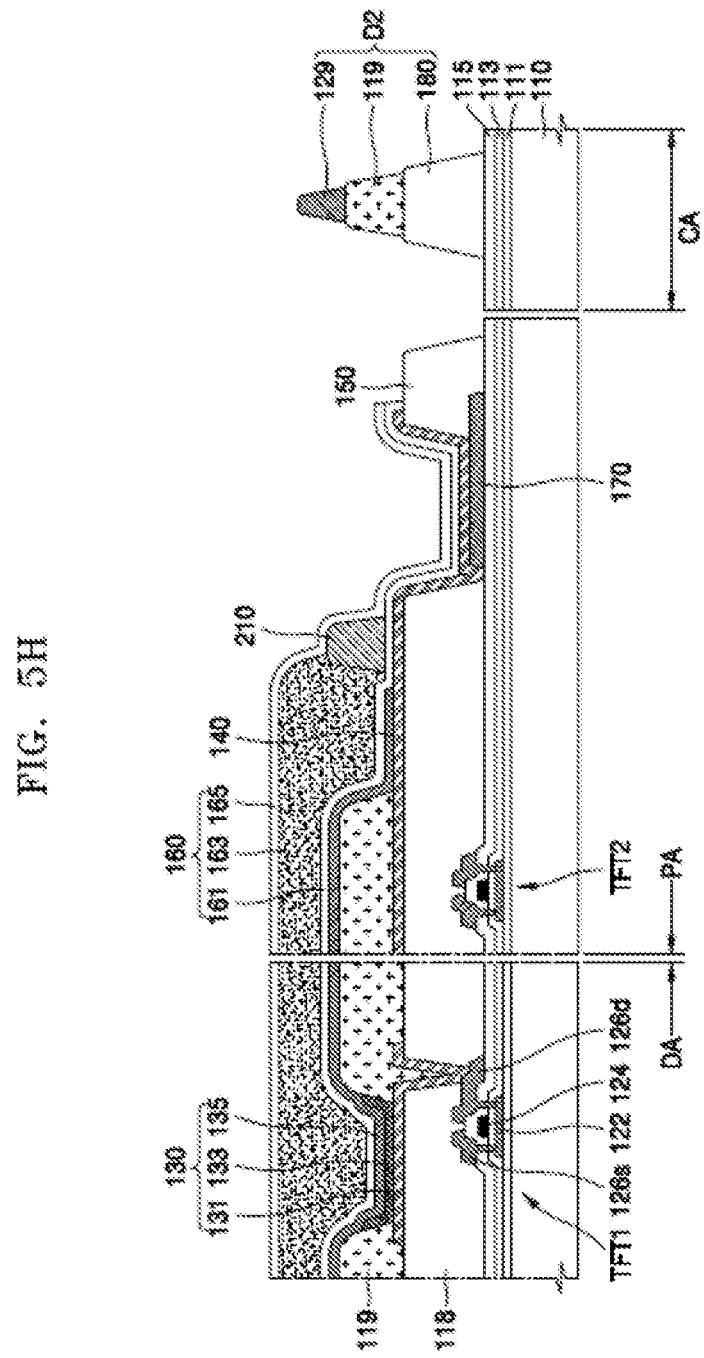

Referring to FIG. 5H, the second dam unit D2 may be separated from the organic light-emitting display device.

In an exemplary embodiment of the present invention, the second dam unit D2 may be formed in an outer portion of a cutting area CA. The cutting area CA may define a region which is finally cut off and is not left as an element of an organic light-emitting display device as a result of a process of forming a plurality of organic light-emitting display devices from a parent substrate.

In an exemplary embodiment of the present invention, a dead space of the organic light-emitting display device may be reduced by using the second dam unit D2, which may prevent damage by a mask during a process, and removing the second dam unit D2 during a final process.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting display device comprising:
a substrate;
a display area over the substrate and comprising a plurality of organic light-emitting diodes each comprising a first electrode, an emission layer, and a second electrode;
a first power supply line located outside the display area and configured to supply power to the plurality of organic light-emitting diodes;
a protective portion disposed on an end of the first power supply line facing away from the display area;
an encapsulation unit comprising a first inorganic encapsulation layer, an organic encapsulation layer, and a second inorganic encapsulation layer, wherein the encapsulation unit is positioned in the display area; and
a dam unit arranged between the first inorganic encapsulation layer and the second inorganic encapsulation layer in a thickness direction of the substrate, wherein the dam unit is disposed on an end of the organic encapsulation layer facing away from the display area.

2. The device of claim 1, wherein surface energy of a material included in the dam unit is greater than surface energy of a material included in the organic encapsulation layer.

3. The device of claim 2, wherein the dam unit comprises silicon.

4. The device of claim 1, wherein a thickness of the dam unit is less than a thickness of the organic encapsulation layer.

5. The device of claim 1, wherein the dam unit is located closer to the display area than the first power supply line.

6. The device of claim 1, further comprising a connection conductive layer located outside the display area and configured to connect the second electrode to the first power supply line.

7. The device of claim 6, wherein the connection conductive layer comprises a material that is the same as a material included in the first electrode.

8. The device of claim 6, wherein a first end of the connection conductive layer overlaps the second electrode, and a second end of the connection conductive layer overlaps the first power supply line.

9. The device of claim 6, wherein the connection conductive layer, the first inorganic encapsulation layer, and the second inorganic encapsulation layer are sequentially stacked over the first power supply line.

10. An organic light-emitting display device comprising:
a substrate;
a display area over the substrate and comprising a plurality of organic light-emitting diodes each comprising a first electrode, an emission layer, and a second electrode;
a first power supply line located outside the display area and configured to supply power to the plurality of organic light-emitting diodes;
a protective portion disposed on an end of the first power supply line facing away from the display area;
an encapsulation unit comprising a first inorganic encapsulation layer, an organic encapsulation layer, and a second inorganic encapsulation layer, wherein the encapsulation unit is positioned in the display area;
a dam unit arranged between the first inorganic encapsulation layer and the second inorganic encapsulation layer, wherein the dam unit is disposed on an end of the organic encapsulation layer facing away from the display area;
a thin film transistor arranged over the substrate and electrically connected to a corresponding first electrode of each of the organic light-emitting diodes; and
an organic insulating layer arranged between the thin film transistor and the corresponding first electrode of each of the organic light-emitting diodes, the dam unit being arranged over the organic insulating layer.

11. The device of claim 10, wherein the first power supply line is arranged between the organic insulating layer and the protective portion.

12. The device of claim 10, wherein the protective portion comprises a material that is the same as a material included in the organic insulating layer.

* * * * *